United States Patent [19]

Marshall, Jr.

[11] 4,300,062

[45] Nov. 10, 1981

[54] OFFSET COMPENSATION CIRCUIT FOR CHARGE-COUPLED DEVICES

[75] Inventor: Donald E. Marshall, Jr., Harvard, Mass.

[73] Assignee: Honeywell Inc., Minneapolis, Minn.

[21] Appl. No.: 34,843

[22] Filed: Apr. 30, 1979

[51] Int. Cl.³ .................. H03K 3/353; H03K 3/42; H01L 29/78; H01L 27/14
[52] U.S. Cl. .................................. 307/304; 307/311; 357/24; 357/30
[58] Field of Search .............. 307/221 D, 304, 311; 357/24, 30

[56] References Cited

U.S. PATENT DOCUMENTS

| | | | |
|---|---|---|---|
| 3,876,952 | 4/1975 | Weimer | 357/24 |
| 3,969,634 | 7/1976 | Su et al. | 357/24 |
| 4,135,104 | 1/1979 | Allen | 357/24 |
| 4,162,411 | 7/1979 | Sakaue et al. | 357/24 |

OTHER PUBLICATIONS

Sequin et al., *Charge Transfer Devices*, Academic Press, N.Y. (1975) pp. 48-50, 58-59, 270-274.
Zimmerman et al., "A New Role for Charge-Coupled Devices . . . " Electronics (Mar. 31, 1977) pp. 97-103.

*Primary Examiner*—Gene M. Munson
*Attorney, Agent, or Firm*—Laurence J. Marhoefer; Lockwood D. Burton; Mitchell J. Halista

[57] ABSTRACT

A circuit for removing the DC or background representing charge component of a signal to be retrieved from a charge-coupled device to individually compensate for variations of each charge-coupled device circuit. A threshold gate is interposed in a charge flow path between a charge integrating well and an output charge transfer gate. The threshold gate is connected to a potential level which is automatically adjusted to compensate for DC variations in a fixed level of the charge to be extracted from the integrating well. A feedback connection between the threshold gate and the integrating well adjusts the potential level during the integration of a reference charge between the integration of an information signal charge.

7 Claims, 5 Drawing Figures

OFFSET COMPENSATION CIRCUIT FOR CHARGE-COUPLED DEVICES

BACKGROUND OF THE INVENTION

1. Field of the Invention

The present invention relates to charge-coupled devices. More specifically, the present invention is directed to radiation sensors utilizing a matrix of charge-coupled devices.

2. Description of the Prior Art

Charge-coupled devices (CCD's) are used to store and transfer packets of electrical charge representing information in sites or charge wells within the CCD's. CCD's are low leakage devices which conserve the injected charge and do not internally generate charge. The input charge can be injected either into a CCD input terminal or into the charge well if it is responsive to input photons. To achieve desired economics, CCD's must be of very high density with each well being relatively small and storing or integrating small amounts of charge. Radiation sensors or imagers containing a matrix of hundreds or thousands of radiation detectors utilizing charge-coupled devices (CCD's) are well-known in the art, e.g., as shown in U.S. Pat. No. 3,876,952, to perform focal plane signal processing functions including signal multiplexing and time-delay-and integration (TDI). One of the problems associated with such focal planes containing a large number of CCD detectors is the variability of gain and DC offset from detector to detector. A prior art method of correcting these non-uniformities is based on the use of a feedback circuit after the signal multiplexer for individually correcting each output signal. Such correction circuits are complex and significantly increase the product cost of the radiation sensor matrix. An additional problem which is encountered n radiation detector focal planes is the large CCD storage wells required to handle the DC charge produced by radiation detector leakage current and background photon flux reaching the detector. In TDI circuits, where the charge from a number of detectors is added to improve the signal-to-noise ratio, this DC charge problem can impose a severe limitation on the number of TDI stages which can be cascaded. A prior art circuit for removing the DC or background representing charge components of a signal with respect to a charge-coupled device in a shift register is shown in U.S. Pat. No. 3,969,634. While this circuit subtracts a DC charge to provide a background subtraction it does not individually compensate for variations of each input circuit. Thus, that prior art approach does not recognize individual variations of the separate input circuits and, accordingly, does not maximize the output from each radiation sensor. Further, in order to provide a suitable background subtraction circuit it must be applicable to both monolithic and hybrid focal plane sensors and to both source and gate coupled inputs for photoconductive and photovoltaic radiation detectors. Additionally, the area of the detector and its associated CCD input circuit should be as small as possible in order to achieve the highest performance or resolution of the radiation sensor to maximize its application potential.

SUMMARY OF THE INVENTION

An object of the present invention is to provide an improved background subtraction circuit for CCD radiation sensors.

In accomplishing this and other objects, there has been provided, a CCD compensating circuit having a charge gating circuit at a CCD output to provide a charge gating operation in accordance with a reference potential developed from a reference charge. The circuit includes a charge threshold gate coupling a charge integrating well means to a charge output and a feedback means for applying the threshold potential to the threshold gate to control the charge transfer from the well means.

BRIEF DESCRIPTION OF THE DRAWING

A better understanding of the present invention may be had when the following detailed description is read in connection with the accompanying drawings, in which.

DESCRIPTION OF THE PREFERRED EMBODIMENT

Figure 1:
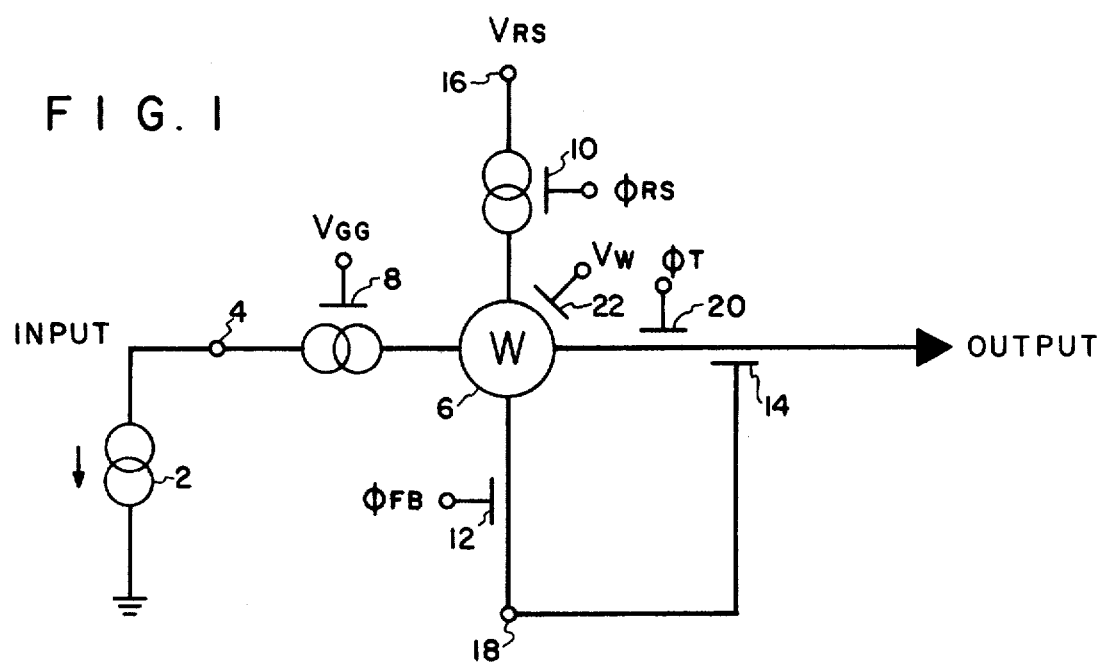
FIG. 1 is a schematic diagram illustration of an example of a compensating circuit embodying the present invention.

The example of the present invention shown in FIG. 1 includes a basic input structure with a source coupled circuit in which the detector, shown as an input current source 2, is coupled to the CCD input source diffusion 4. An input charge is integrated into the integrating well 6 through a bias gate 8 set at a DC potential $V_{gg}$. The circuit is equally applicable to a gate coupled input or to a monolithic focal plane in which the incident photons generate charge carriers directly in the integrating well 6. The offset compensation circuit consists of gates 10, 12, and 14 as well as integrated diffusions 16 and 18. An output transfer gate 20 is arranged to transfer a charge at the integrating wall 6.

In operation, without the compensation circuit of the present invention, an input charge is integrated into the integrating well 6 for a period of time and periodically transferred out by selectively enabling the output transfer gate 20. From there, the charge packet flows into a TDI or multiplexing portion (not shown) of the CCD. By adding a threshold control gate 14 after the transfer gate 20 and setting the appropriate control potential level ($\phi_{TH}$) to be applied to it only a charge in excess of a fixed level ($Q_o$) can flow out of the integrating well 6. The charge that remains in the integrating well 6 can then be dumped out through the drain diffusion 16 when the drain transfer gate 10 is enabled. The potential $V_{rs}$ for the drain diffusion 16 is set at a high potential.

Figure 2:
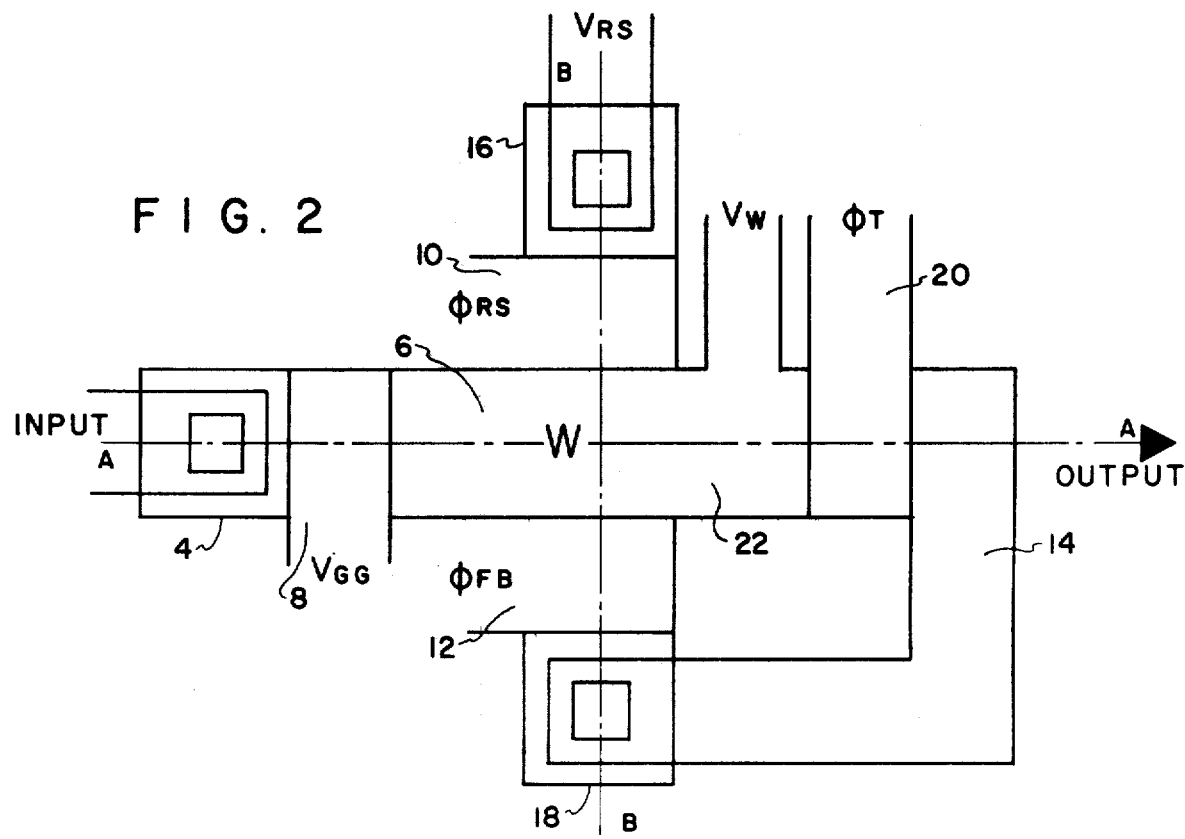
FIG. 2 is a plan view of a semiconductor chip in which the example of the compensating circuit shown in FIG. 1 is formed.
Figure 3:
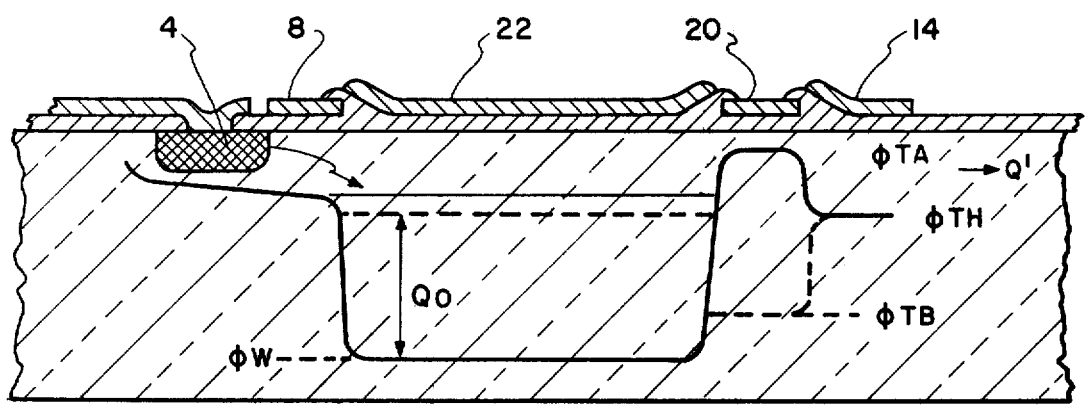
FIG. 3 is a cross-sectional view of the chip shown in FIG. 2 taken along line A—A of FIG. 2.
Figure 4:
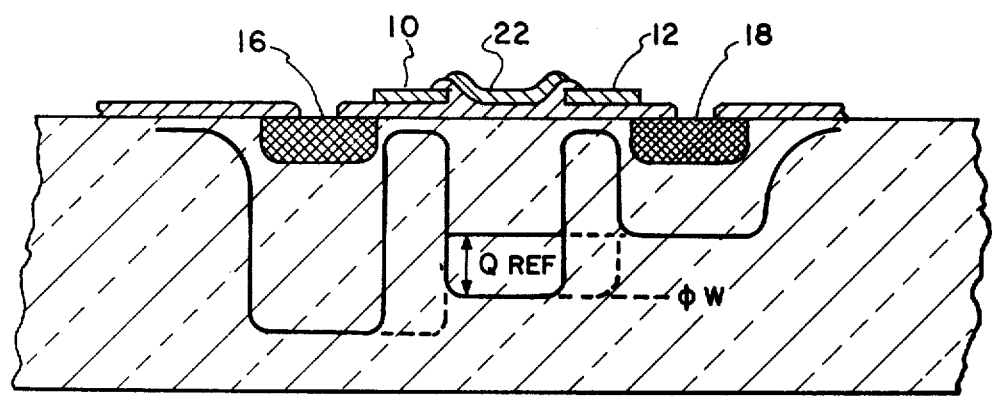
FIG. 4 is a cross-sectional diagram of the chip shown in FIG. 2 taken along line B—B.

FIG. 3 is a potentional diagram of the circuit shown in FIG. 2 through a cross-section A—A and FIG. 4 is a potential diagram of the circuit shown in FIG. 2 along a cross-section B—B. The offset compensation circuit of the present invention automatically adjusts the level $\phi_{TH}$ of the gate 14. This is done when the photodetector is viewing a temperature reference radiation source. In a non-scanning, or staring, mosaic focal plane utilizing the CCD elements, the temperature reference can be supplied by a light chopper while in a scanning focal plane, the temperature reference can be viewed when the focal plane detector array scans off the field of view onto the field stop. While the detector array is viewing the temperature reference, the charge $Q_{REF}$ is integrated into the well 6 and the gate 12 is enabled. This permits charge flow between the well 6 and the floating diffusion 18, and the floating diffusion 18 will seek the potential level of the charge in the well 6. Subsequently, the gate 12 is disabled and the charge remaining in the well 6 is dumped out by enabling the drain gate 10. This process is repeated until the diffusion 18 has reached the same potential level as that defined by $Q_{REF}$. As the gate 12 is enabled and disabled, the potential level which occurs on the diffusion 18 and in the well 6 will be modulated up and down due to the charge stored under the gate 12. However, if a clock signal is used for actuating the gate 12, this will not disturb the potential balance between the well 6 and the diffusion 18. The equilibration of the diffusion 18 to the potential level $Q_{REF}$ is bidirectional, i.e., if the diffusion 18 is either too high or too low in potential it will eventually reach the same level as $Q_{REF}$ as the cycle is repeated. Noise which may be present in the $Q_{REF}$ charge is also diminished in its influence on the diffusion 18 potential level because it is spread out over a larger capacitance of the receiving well 6 and the capacitance of the diffusion 18 plus its interconnection to gate 14. By making the capacitance of the diffusion 18 large, the effective noise can be made diminishingly small. This is equivalent to reducing the bandwidth of the feedback circuits since its response time to drift in the $Q_{REF}$ level is also increased.

The threshold gate 14 is connected to the diffusion 18 so that the potential level $\phi_{TH}$ changes as the $Q_{REF}$ level changes. The $\phi_{TH}$ potential level determines the amount of charge which is transferred out of the well 6 when the output transfer gate 20 is enabled. The potential of the threshold gate 14 is different from that of the diffusion 18 by a fixed threshold voltage $V_t$ due to the differences in work function of the diffusion 18 and the gate 14. In enhanced mode MOSFET devices, which are typical of CCD processing structures, this threshold voltage is in the direction to decrease the charge flow out of the well 6 when the output transfer gate 20 is enabled. When the detector is no longer viewing the temperature reference but is viewing an object which has signal information contained in it, the charge integrated into the well 6 is higher or lower than the $Q_{REF}$ level so that more or less charge, respectively, flows out of the well 6 when the output transfer gate 20 is enabled. In this manner, the circuit automatically subtracts a variable charge level which is a function of the $Q_{REF}$ level and retains in its output a DC charge which is a function of $V_t$ plus or minus a signal charge. If the temperature reference is sufficiently cold compared to the signal information object temperature, some of the charge will always flow across the gates 14 and 20.

When the charge flows out of the well 6 under the threshold gate 14, its potential level will be depressed slightly in the direction to cutoff further charge flow since the diffusion 18 and threshold gate 14 combination is floating. However, when nearly all of the charge is transferred, the amount of charge under the threshold gate 14 decreases so that the threshold gate 14 returns to its reference level. Thus, no error in the output is produced by this operation.

The amount of DC charge which flows out of the well 6 can be controlled simultaneously on all detector input circuits on the focal plane. This is achieved by changing the gate potential $V_w$ for the integrating well gate 22 for all circuits concurrently as the detector stops viewing the temperature reference and starts viewing the object information signal. An external control circuit (not shown) can be used to sense the average charge out of the CCD and to control the amplitude of the potential $V_w$ on the well gate 22 to maintain a fixed output DC level. This approach can be especially useful when the average input signal (background temperature) changes with respect to the temperature reference.

When the threshold gate 20 is enabled, the potential level in the integrating well 6 will be depressed since the charge integrated into it will spread under the threshold gate 20. This will reduce the charge flowing out of the well 6. If this change in potential level is too large, it can be compensated for by modulating the potential $V_w$ for the well gate 22 as previously discussed.

The gates 14 and 20 can be interchanged to an alternate arrangement from that shown in FIG. 1. If this is done, the effect discussed above does not occur. However, when the charge is now integrated into the well 6 it will also flow under the gate 14. When the threshold gate 20 is enabled, the charge under the gate 14 will empty out, and a potential change will occur in the diffusion 18 and gate 14 combination. Thus, more charge will flow out of the well 6 then is expected by the level set on the gate 14 and diffusion 18 combination when the detector is viewing the temperature reference. This effect can also be compensated for by modulating the potential $V_w$ on the well gate 22 as previously discussed. A possible advantage of interchanging the gates 14 and 20 is that in the overlapping gate double polysilicon CCD manufacturing process the gates 8, 10, 12 and 14 can be a first polysilicon and the gates 22 and 20 can be a second polysilicon. The uniformity of the threshold voltage $V_t$ may be better for the first polysilicon whereby making the gate 14 the first polysilicon can reduce variations in output charge to minimize this source of error.

Figure 5:
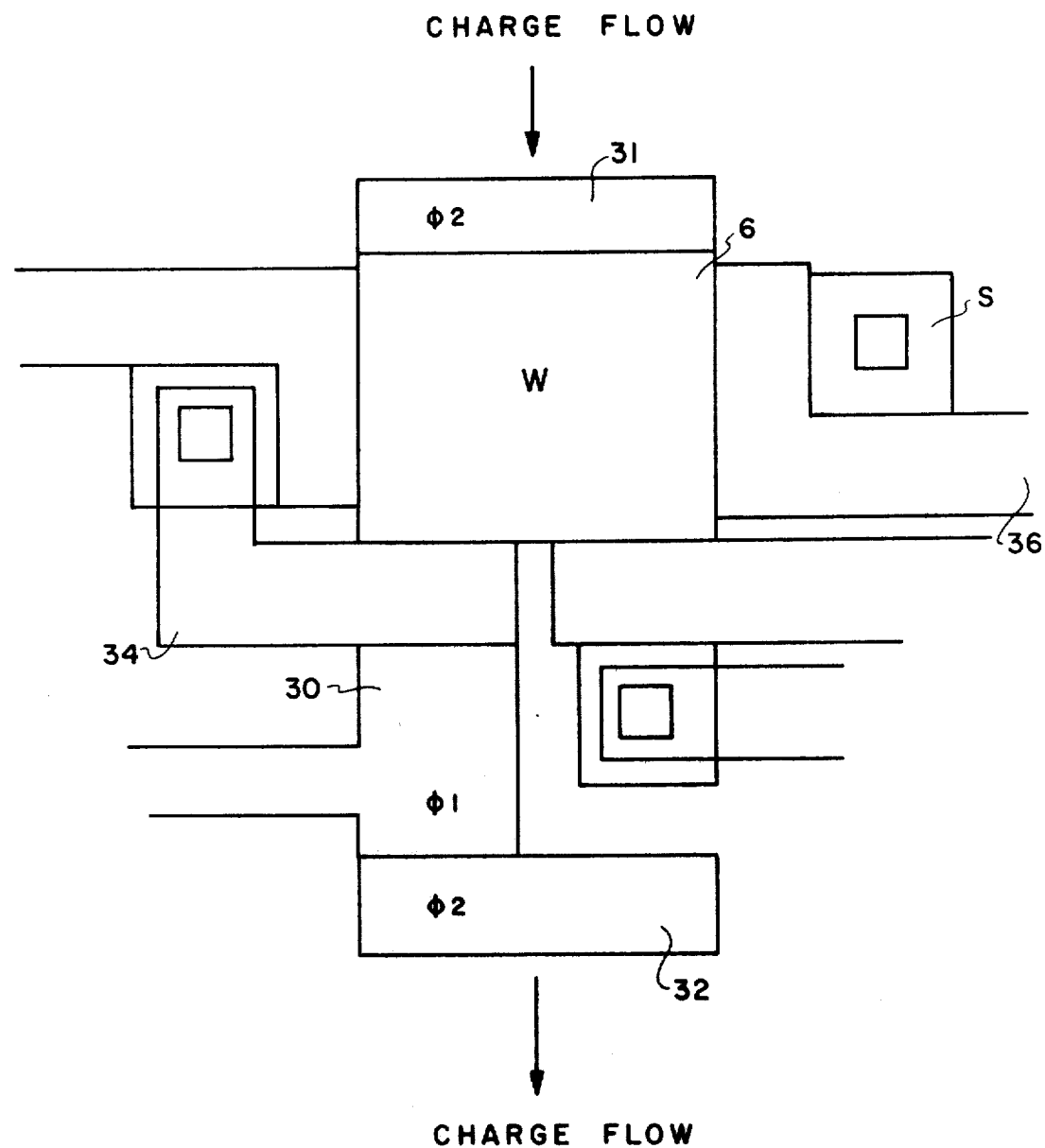
FIG. 5 is a modified chip layout also embodying an example of the present invention.

A technique which can be used in TDI CCD registers to conserve space is to eliminate the threshold gate 20 and to let the charge integrate directly into the TDI shift register. This technique can also be implemented with the offset compensation circuit of the present invention. A possible layout is shown in FIG. 5 (channel stops and gate overlaps are not shown) for a two phase shift register. When the detector using the CCD arrangement of FIG. 5 is viewing the temperature reference, the TDI shift register is disabled by means of the $\phi_1$ and $\phi_2$ potentials on the gates 30, 31, and 32. The compensation cycle discussed earlier with respect to FIG. 1 and gate 14 is performed to set the level of the threshold gate 34 relative to the $Q_{REF}$ charge in the well 6. When the detector is viewing the information signal, the charge is integrated into the well 6 and the gate 30 is enabled forming a storage well to receive the charge which spills over the threshold gate 34. Then the gate 36 is enabled to dump the charge remaining in the well 6. After the well 6 is empty, the gate 36 is disabled, and the gate 32 is enabled. The gate 30 and the gate 32 are disabled sequentially so that the charge under the gate 30 is pushed to the next integrating well (not shown) in the TDI shift register.

Accordingly, it may be seen, that there has been provided, in accordance with the present invention, an offset compensation circuit for charge-coupled devices.

The embodiments of the invention in which an exclusive property or privilege is claimed are defined as follows:

1. A compensating circuit for a radiation sensing circuit comprising
   a charge integrating well means for accumulating a charge signal,
   a charge output
   a first charge threshold gate for connecting said well means to said output, and
   feedback means connected between said well means and said charge gate for applying a threshold potential to said first charge gate representative of a preselected charge integrated by said well means, said feedback means including a charge storing diffusion, a second charge gate connecting said diffusion to said well means and circuit means connecting said diffusion to said first charge gate to apply said threshold potential to said first charge gate wherein said well means is responsive to input photons to generate said charge signal.

2. A compensating circuit as set forth in claim 1 wherein said integrating well means includes an integrating well and an output transfer gate located between said well and said first charge threshold gate.

3. A compensating circuit as set forth in claims 2 wherein said well means includes an input diffusion and an input gate for connecting said input means to said well.

4. A compensating circuit as set forth in claim 1 wherein said integrating well means includes a dump diffusion and a dump gate connecting said dump diffusion to said integrating well.

5. A compensating circuit as set forth in claim 2 wherein said integrating well means includes a dump diffusion and a dump gate connecting said dump diffusion to said integrating well, said transfer gate being energized to pass a charge from said well between the energizations of said second gate and said transfer gate.

6. A method for removing a background charge component from a charge coupled device stored signal comprising the steps of
   storing a reference signal representing charge in a charge integrating means,
   acquiring a threshold potential from said stored reference charge,
   isolating the threshold potential from the charge integrating means,
   applying the threshold potential to a threshold gate,
   dumping said reference signal charge,
   storing a composite input signal representing charge in the integrating means, and
   gating the input signal charge from the integrating means in accordance with the threshold potential.

7. A method as set forth in claim 6 and including the further step of gating an input signal charge by a transfer gate in combination with the threshold gate after the storing of the input signal.

* * * * *